United States Patent
Erickson et al.

(10) Patent No.: US 9,559,296 B2
(45) Date of Patent: Jan. 31, 2017

(54) METHOD FOR PROVIDING A PERPENDICULAR MAGNETIC ANISOTROPY MAGNETIC JUNCTION USABLE IN SPIN TRANSFER TORQUE MAGNETIC DEVICES USING A SACRIFICIAL INSERTION LAYER

(71) Applicant: Samsung Electronics Co., Ltd., Gyeonggi-do (KR)

(72) Inventors: Dustin William Erickson, Morgan Hill, CA (US); Xueti Tang, Fremont, CA (US); Jangeun Lee, Cupertino, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/712,792

(22) Filed: May 14, 2015

(65) Prior Publication Data
US 2016/0005954 A1   Jan. 7, 2016

Related U.S. Application Data

(60) Provisional application No. 62/020,932, filed on Jul. 3, 2014.

(51) Int. Cl.
| | |
|---|---|
| *H01L 43/00* | (2006.01) |
| *H01L 43/12* | (2006.01) |
| *H01L 43/08* | (2006.01) |

(52) U.S. Cl.
CPC ............... *H01L 43/12* (2013.01); *H01L 43/08* (2013.01)

(58) Field of Classification Search
None
See application file for complete search history.

(56) References Cited

U.S. PATENT DOCUMENTS

| | | |
|---|---|---|
| 6,004,877 A | 12/1999 | Chang |
| 7,368,299 B2 | 5/2008 | Lee |
| 7,476,919 B2 | 1/2009 | Hong |
| 7,524,381 B2 | 4/2009 | Thai |

(Continued)

OTHER PUBLICATIONS

"Enhancement of STT-RAM characteristics by wet clean treatment after MTJ etch process," J.N. Kim, MRS Proceedings, vol. 1458, Aug. 2, 2012, http://dx.doi.org/10.1557/opl.2012.1349.

(Continued)

*Primary Examiner* — Mandy Louie
(74) *Attorney, Agent, or Firm* — Convergent Law Group LLP

(57) ABSTRACT

A method for providing a magnetic junction usable in a magnetic device and the magnetic junction are described. The method includes providing a free layer, a pinned layer and a nonmagnetic spacer layer between the free layer and the pinned layer. The free layer is switchable between a plurality of stable magnetic states when a write current is passed through the magnetic junction. At least one of the step of providing the free layer includes a first plurality of steps and the step of providing the pinned layer includes a second plurality of steps. The first and second plurality of steps include depositing a portion of a layer, depositing a sacrificial layer, annealing the portion of the magnetic junction under the sacrificial layer, and depositing a remaining portion of the layer. The layer may be the free layer, the pinned layer, or both.

17 Claims, 11 Drawing Sheets

(56) References Cited

U.S. PATENT DOCUMENTS

| | | | |
|---|---|---|---|
| 7,855,123 B2 | 12/2010 | Lee | |
| 7,863,060 B2 | 1/2011 | Belen | |
| 7,965,543 B2 | 6/2011 | Slaughter | |
| 8,105,948 B2 | 1/2012 | Zhong | |
| 8,138,561 B2 | 3/2012 | Horng | |
| 8,138,562 B2 | 3/2012 | Mao | |
| 8,143,683 B2 | 3/2012 | Wang | |
| 8,202,572 B2 | 6/2012 | Zhao | |
| 8,227,351 B2 | 7/2012 | Li | |
| 8,259,420 B2 | 9/2012 | Zhao | |
| 8,318,510 B2 | 11/2012 | Choi | |
| 8,378,330 B2 | 2/2013 | Horng | |
| 8,421,137 B2 | 4/2013 | Li | |
| 8,431,418 B2 | 4/2013 | Choi | |
| 8,530,887 B2 | 9/2013 | Kitagawa | |
| 8,698,260 B2 | 4/2014 | Jan | |
| 2007/0278602 A1* | 12/2007 | Raberg | H01L 43/08 257/421 |
| 2009/0073737 A1* | 3/2009 | Klostermann | G11C 5/02 365/53 |
| 2009/0159562 A1 | 6/2009 | Cho | |
| 2009/0266790 A1 | 10/2009 | Balamane | |
| 2012/0264234 A1 | 10/2012 | Zhou | |
| 2012/0299132 A1 | 11/2012 | Lin | |
| 2013/0037896 A1 | 2/2013 | Park | |
| 2013/0064971 A1 | 3/2013 | Carey | |
| 2013/0244192 A1 | 9/2013 | He | |
| 2013/0264665 A1 | 10/2013 | Jan | |
| 2013/0277778 A1 | 10/2013 | Hsu | |
| 2013/0299823 A1 | 11/2013 | Cao | |
| 2014/0021426 A1 | 1/2014 | Lee | |
| 2014/0022839 A1 | 1/2014 | Park | |
| 2014/0099735 A1 | 4/2014 | Horng | |
| 2014/0103469 A1 | 4/2014 | Jan | |

OTHER PUBLICATIONS

"Parallel fabrication of magnetic tunnel junction nanopillars by nanosphere lithography," W.G. Wang, Scientific Reports, vol. 3, No. 1948, pp. 1-6, Jun. 6, 2013, http://dx.doi.org/10.1038/srep01948.

"Lower-current and fast switching of a perpendicular TMR for high speed and high density spin-transfer-torque MRAM," T.Kishi, Electron Devices Meeting 2008, pp. 1-4, Dec. 17, 2008, http://dx.doi.org/10.1109/IEDM.2008.4796680.

* cited by examiner

| 300 | |
|---|---|
| 1st Ferromagnetic Layer (CoFeB) | 312 |
| Seed Layer(s) (MgO) | 302 |

FIG. 10

| 300 | |
|---|---|
| Sacrificial Insertion Layer (W) | 304 |
| 1st Ferromagnetic Layer (CoFeB) | 312 |
| Seed Layer(s) (MgO) | 302 |

FIG. 11

| 300 | |
|---|---|
| 1st Ferromagnetic Layer (CoFeB) | 312' |
| Seed Layer(s) (MgO) | 302 |

| 300 | |
|---|---|
| 2nd Ferromagnetic Layer (CoFeB) | 314 |
| 1st Ferromagnetic Layer (CoFeB) | 312' |
| Seed Layer(s) (MgO) | 302 |

| 300 | |
|---|---|
| Nonmagnetic Spacer Layer (MgO) | 320 |
| 2nd Ferromagnetic Layer (CoFeB) | 314 |
| 1st Ferromagnetic Layer (CoFeB) | 312' |
| Seed Layer(s) (MgO) | 302 |

FIG. 14

METHOD FOR PROVIDING A
PERPENDICULAR MAGNETIC
ANISOTROPY MAGNETIC JUNCTION
USABLE IN SPIN TRANSFER TORQUE
MAGNETIC DEVICES USING A
SACRIFICIAL INSERTION LAYER

CROSS-REFERENCE TO RELATED
APPLICATIONS

This application claims the benefit of provisional Patent Application Ser. No. 62/020,932, filed Jul. 3, 2014, entitled "MAGNETIC PROPERTIES BY REMOVAL OF ABSORPTION LAYER IN MTJ FILMS AND DUAL PATTERNING PROCESS, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a substrate 12. A bottom contact 14 and top contact 24 may be used to drive current through the conventional MTJ 10. The conventional MTJ, uses conventional seed layer(s) (not shown), may include capping layers (not shown) and may include a conventional antiferromagnetic (AFM) layer (not shown). The conventional magnetic junction 10 includes a conventional pinned layer 16, a conventional tunneling barrier layer 18, and a conventional free layer 20. Also shown is top contact 22. Conventional contacts 14 and 24 are used in driving the current in a current-perpendicular-to-plane (CPP) direction, or along the z-axis as shown in FIG. 1. Typically, the conventional pinned layer 16 is closest to the substrate 12 of the layers 16, 18 and 20.

The conventional pinned layer 16 and the conventional free layer 20 are magnetic. The magnetization 17 of the conventional pinned layer 16 is fixed, or pinned, in a particular direction. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic.

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as perpendicular-to-plane, the magnetization 21 of the conventional free layer 20 may be in plane. Thus, the pinned layer 16 and free layer 20 may have their magnetizations 17 and 21, respectively oriented perpendicular to the plane of the layers.

To switch the magnetization 21 of the conventional free layer 20, a current is driven perpendicular to plane (in the z-direction). When a sufficient current is driven from the top contact 22 to the bottom contact 14, the magnetization 21 of the conventional free layer 20 may switch to be parallel to the magnetization 17 of the conventional pinned layer 16. When a sufficient current is driven from the bottom contact 11 to the top contact 22, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

Because of their potential for use in a variety of applications, research in magnetic memories is ongoing. For example, mechanisms for improving the performance of STT-RAM are desired. Accordingly, what is needed is a method and system that may improve the performance of the spin transfer torque based memories. The method and system described herein address such a need.

BRIEF SUMMARY OF THE INVENTION

A method for providing a magnetic junction usable in a magnetic device and the magnetic junction are described. The method includes providing a free layer, a pinned layer and a nonmagnetic spacer layer between the free layer and the pinned layer. The free layer is switchable between stable magnetic states when a write current is passed through the magnetic junction. At least one of the step of providing the free layer includes a first plurality of steps and the step of providing the pinned layer includes a second plurality of steps. The first and second plurality of steps include depositing a portion of a layer, depositing a sacrificial layer, annealing the portion of the magnetic junction under the sacrificial layer, and depositing a remaining portion of the layer. The layer may be the free layer, the pinned layer, or both. Thus, the first plurality of steps includes depositing a first portion of the free layer, depositing a first sacrificial layer, annealing at least the first portion of the free layer and the first sacrificial layer at a first temperature greater than 25 degrees Celsius, removing the first sacrificial layer; and depositing a second portion of the free layer. The second plurality of steps includes depositing a first portion of the pinned layer, depositing a second sacrificial layer, annealing at least the first portion of the pinned layer and the second sacrificial layer at a second temperature greater than 25 degrees Celsius, defining a portion of the magnetic junction including the free layer, the nonmagnetic spacer layer and the first portion of the pinned layer, removing the second sacrificial layer and depositing a second portion of the pinned layer.

BRIEF DESCRIPTION OF SEVERAL VIEWS OF
THE DRAWINGS

FIGS. 10-22 depicts an exemplary embodiment of a magnetic junction usable in a magnetic memory programmable using spin transfer torque during fabrication.

DETAILED DESCRIPTION OF THE INVENTION

Figure 1:
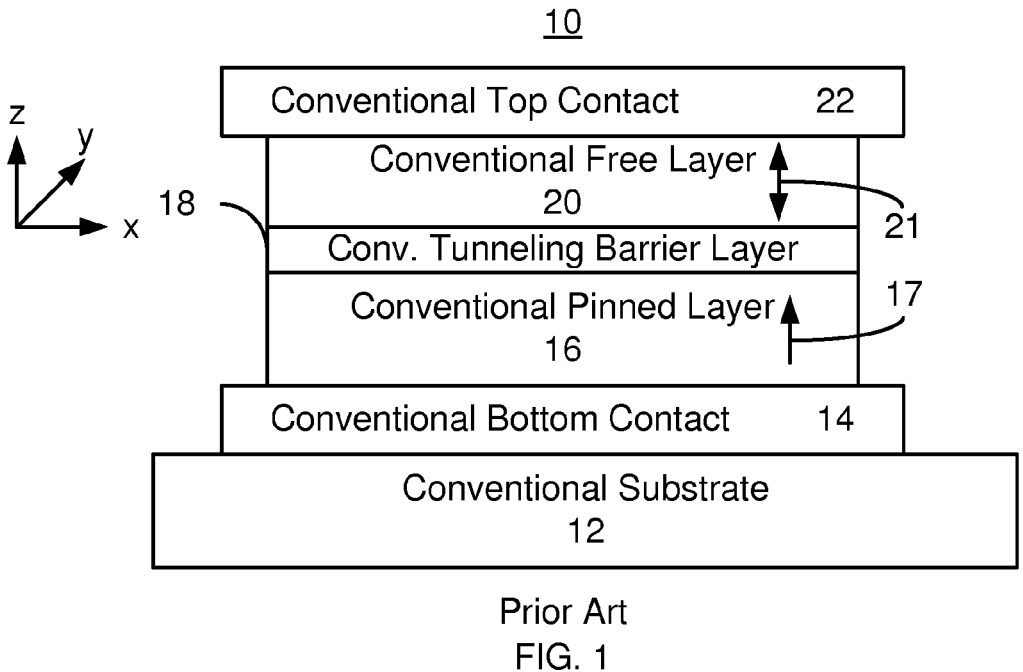
FIG. 1 depicts a conventional magnetic junction.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing a magnetic junction as well as a magnetic memory utilizing the magnetic junction are described. The exemplary embodiments provide a method for providing a magnetic junction usable in a magnetic device and the magnetic junction. The method includes providing a free layer, a pinned layer and a nonmagnetic spacer layer between the free layer and the pinned layer. The free layer is switchable between stable magnetic states when a write current is passed through the magnetic junction. At least one of the step of providing the free layer includes a first plurality of steps and the step of providing the pinned layer includes a second plurality of steps. The first and second plurality of steps include depositing a portion of a layer, depositing a sacrificial layer, annealing the portion of the magnetic junction under the sacrificial layer, and depositing a remaining portion of the layer. The layer may be the free layer, the pinned layer, or both. Thus, the first plurality of steps includes depositing a first portion of the free layer, depositing a first sacrificial layer, annealing at least the first portion of the free layer and the first sacrificial layer at a first temperature greater than 25 degrees Celsius, removing the first sacrificial layer; and depositing a second portion of the free layer. The second plurality of steps includes depositing a first portion of the pinned layer, depositing a second sacrificial layer, annealing at least the first portion of the pinned layer and the second sacrificial layer at a second temperature greater than 25 degrees Celsius, defining a portion of the magnetic junction including the free layer, the nonmagnetic spacer layer and the first portion of the pinned layer, removing the second sacrificial layer and depositing a second portion of the pinned layer.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used.

Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 2:
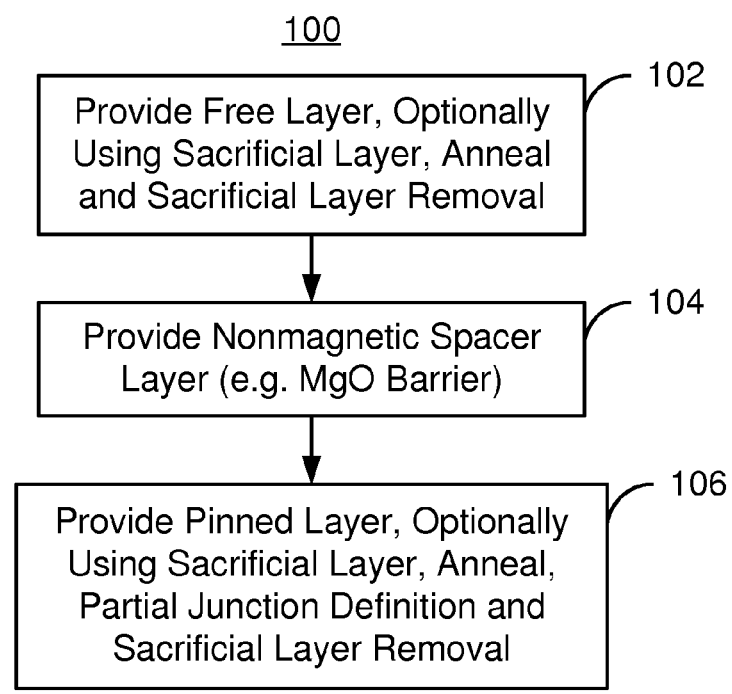
FIG. 2 depicts an exemplary embodiment of a method for providing a magnetic junction usable in a magnetic memory and programmable using spin transfer torque.

FIG. 2 depicts an exemplary embodiment of a method 100 for fabricating a magnetic junction usable in a magnetic device such as a spin transfer torque random access memory (STT-RAM) and, therefore, in a variety of electronic devices. For simplicity, some steps may be omitted, performed in another or combined. Further, the method 100 may start after other steps in forming a magnetic memory have been performed.

A free layer is provided, via step 102. Step 102 includes depositing the material(s) for the free layer. The free layer may be deposited on seed layer(s). The seed layer(s) may be selected for various purposes including but not limited to the desired crystal structure of the free layer, magnetic anisotropy and/or magnetic damping of the free layer. For example, the free layer may be provided on a seed layer such as a crystalline MgO layer that promotes a perpendicular magnetic anisotropy in the free layer. If a dual magnetic junction is fabricated, the free layer may be formed on another nonmagnetic spacer layer. This nonmagnetic spacer layer may be the MgO seed layer discussed above. A pinned layer is formed under such a spacer layer.

The free layer provided in step 102 may be desired to have a perpendicular magnetic anisotropy that exceeds is demagnetization energy. The magnetic moment of the free layer may thus be stable out-of-plane, including perpendicular-to-plane. In addition, a polarization enhancement layer (PEL) may be provided as part of or in addition to the free layer. A PEL includes high spin polarization materials. The free layer provided in step 102 is also configured to be switched between stable magnetic states when a write current is passed through the magnetic junction. Thus, the free layer is switchable utilizing spin transfer torque. The free layer provided in step 102 is magnetic and thermally stable at operating temperatures. Although step 102 is discussed in the context of providing a free layer, the edges of the free layer may be defined from the stack being provided at a later time.

In some embodiments, step 102 includes additional steps. In such embodiments, a first portion of the free layer is deposited first. The first portion of the free layer may include a magnetic layer including Co, Fe and/or B. For example, a CoFeB layer, having not more than twenty atomic percent B, may be deposited. In such an embodiment, step 102 also includes depositing a sacrificial insertion layer on the first ferromagnetic layer such that the layers share an interface. The sacrificial insertion layer may include material(s) that have an affinity for boron, that have a low diffusion and that are a relatively good lattice match for the underlying layer. For example, the difference in lattice parameters between the underlying ferromagnetic layer and the sacrificial insertion layer may be less than ten percent. The sacrificial insertion layer may be thin. In some embodiments, the sacrificial insertion layer is less than ten Angstroms thick. In some such embodiments, the sacrificial insertion layer may not exceed five Angstroms and is greater than one Angstrom. For example, the sacrificial insertion layer may be nominally four Angstrom thick. In other embodiments, other thickness(es) may be used. The sacrificial insertion layer and underlying layer(s) are then annealed at temperature(s) above room temperature (e.g. above twenty-five degrees Celsius). For example, a rapid thermal anneal (RTA) at temperature(s) in the range of 300-500 degrees Celsius may be used. Higher temperatures may be used in the RTA, for example if a shorter time is used or a magnetic junction having a bottom free layer is fabricated. In other embodiments, the anneal may be performed in another manner, including but not limited to block heating. The anneal may also be performed at other temperature(s). After the anneal, the sacrificial insertion layer is removed, for example, via a plasma etch. It is believed that in some cases, part of the sacrificial insertion layer may be pushed into the underlying layer by the plasma etch. In other embodiments, the sacrificial insertion layer may be removed in another manner including but not limited to ion milling or chemical mechanical planarization. In the removal step, some portion of the underlying ferromagnetic layer may be removed. The remainder of the free layer, if any, may then be deposited. For example, a second ferromagnetic layer may be deposited on the exposed first ferromagnetic layer. This second ferromagnetic layer may be another CoFeB. In some embodiments, the total amount of magnetic material provided allows the free layer to have a perpendicular magnetic anisotropy that exceeds the demagnetization energy. For example, the first and second ferromagnetic layers together at the end of step 102 may have a total thickness that does not exceed thirty Angstroms and is greater than fifteen Angstroms. In some such embodiments, the total thickness does not exceed twenty-five Angstroms. For example, the total thickness may be at least sixteen Angstroms and less than twenty Angstroms. In other embodiments, the free layer may be formed in another manner.

A nonmagnetic spacer layer is provided, via step 104. In some embodiments, a crystalline MgO tunneling barrier layer may be desired for the magnetic junction being formed. Step 104 may include depositing MgO, which forms a tunneling barrier layer. In some embodiments, step 104 may include depositing MgO using, for example, radio frequency (RF) sputtering. Metallic Mg may be deposited, then oxidized in step 104 to provide a natural oxide of Mg. The MgO barrier layer/nonmagnetic spacer layer may also be formed in another manner. As discussed above with respect to step 102, the edges of the nonmagnetic spacer layer may be defined at a later time, for example after deposition of the remaining layer of the magnetic junction. Step 104 may include annealing the portion of the magnetic junction already formed to provide crystalline MgO tunneling barrier with a (100) orientation for enhanced tunneling magnetoresistance (TMR) of the magnetic junction.

A pinned layer is provided, via step 106. Thus, the nonmagnetic spacer layer is between the pinned layer and the free layer. In some embodiments, the pinned layer is formed in step 106 after formation of the free layer in step 102. In other embodiments, the free layer may be formed first. The pinned layer is magnetic and may have its magnetization pinned, or fixed, in a particular direction during at least a portion of the operation of the magnetic junction. The pinned layer may thus be thermally stable at operating temperatures. The pinned layer formed in step 106 may be a simple (single) layer or may include multiple layers. For example, the pinned layer formed in step 106 may be a SAF including magnetic layers antiferromagnetically or ferromagnetically coupled through thin nonmagnetic layer(s), such as Ru. In such a SAF, each magnetic layer may also include multiple layers. The pinned layer may also be another multilayer. The pinned layer formed in step 106 may have a perpendicular anisotropy energy that exceeds the out-of-plane demagnetization energy. Thus, the pinned layer may have its magnetic moment oriented perpendicular to plane. Other orientations of the magnetization of the pinned layer are possible. In addition, it is noted that other layers, such as a PEL or coupling layer(s) may be inserted between the pinned layer and the nonmagnetic spacer layer.

In some embodiments, step 106 includes multiple steps analogous to those described above for step 102. For example, a first portion of the pinned layer is deposited first. The first portion of the pinned layer may include a magnetic layer including Co, Fe and/or B. For example, a CoFeB layer, having not more than twenty atomic percent B, may be deposited. A PEL or other structure may also have been deposited between the pinned layer and the nonmagnetic spacer layer. In such an embodiment, step 106 also includes depositing another sacrificial insertion layer on the portion of the pinned layer that has been formed. In some embodiments, the sacrificial insertion layer is deposited directly on the ferromagnetic layer. In other embodiments, other layer(s) may be deposited between the ferromagnetic layer and the sacrificial insertion layer. The sacrificial insertion layer may include material(s) that have an affinity for boron, that have a low diffusion and that are a relatively good lattice match for the underlying layer. For example, the difference in lattice parameters between the underlying ferromagnetic layer and the sacrificial insertion layer may be less than ten percent. The sacrificial insertion layer may be thin. In some embodiments, the sacrificial insertion layer has the same thickness as described above for the free layer. In other embodiments, other thickness(es) may be used. The sacrificial insertion layer is, however, desired to be continuous to allow for patterning, discussed below. The sacrificial insertion layer and underlying layer(s) are then annealed at temperature(s) above room temperature. For example, an RTA at temperature(s) in the range of 300-500 degrees Celsius may be used. In other embodiments, the anneal may be performed in another manner. The anneal may be analogous to that described above in step 102. After the anneal, the portion of the magnetic junction under the sacrificial insertion layer is defined. For example, the edges of the magnetic junction may be defined using a photolithographic mask and an ion mill or other mechanism for etching the layers. A nonmagnetic insulating layer such as alumina may be deposited to refill the region around the magnetic junction. A planarization might also be performed. The sacrificial layer may then be removed, for example via plasma etching. Other removal methods may also be used. In the removal step, some portion of the underlying ferromagnetic layer may be removed. The remainder of the pinned layer, if any, may then be deposited. For example, additional ferromagnetic layer(s) may be deposited directly on the exposed first ferromagnetic layer. In embodiments in which the pinned layer is a SAF, is a nonmagnetic layer such as Ru may be deposited and another magnetic layer provided on the nonmagnetic layer. In other embodiments, the pinned layer may be formed in another manner.

Figure 3:
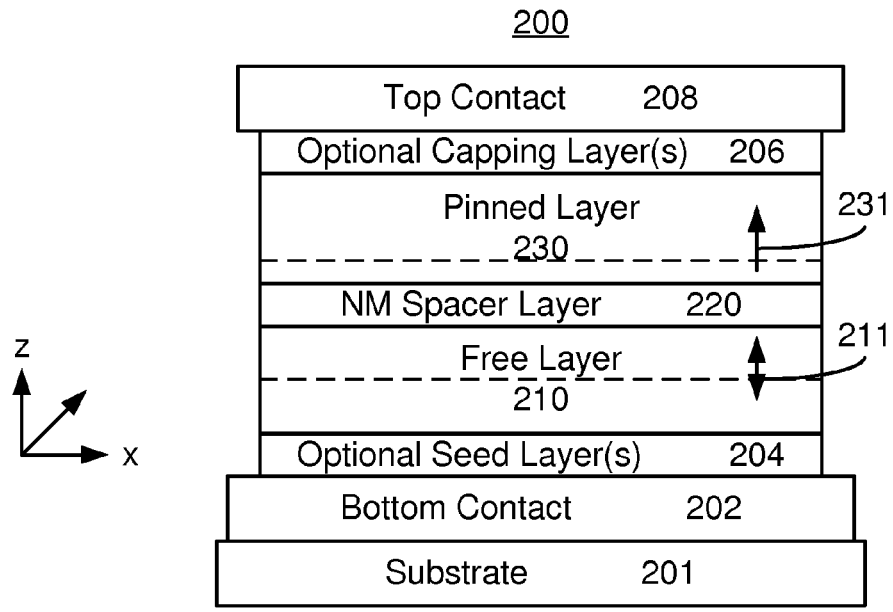
FIG. 3 depicts an exemplary embodiment of a magnetic junction usable in a magnetic memory programmable using spin transfer torque.

FIG. 3 depicts an exemplary embodiment of a magnetic junction 200 that may be fabricated using the method 100, as well as surrounding structures. For clarity, FIG. 3 is not to scale. The magnetic junction 200 may be used in a magnetic device such as a STT-RAM and, therefore, in a variety of electronic devices. The magnetic junction 200 includes a free layer 210 having magnetic moment 211, a nonmagnetic spacer layer 220, and a pinned layer 230 having magnetic moment 231. Also shown is an underlying substrate 201 in which devices including but not limited to a transistor may be formed. Bottom contact 202, top contact 208, optional seed layer(s) 204 and optional capping layer(s) 206 are also shown. As can be seen in FIG. 3, the pinned layer 230 is closer to the top (furthest from a substrate 201) of the magnetic junction 200. An optional pinning layer (not shown) may be used to fix the magnetization (not shown) of the pinned layer 230. In some embodiments, the optional pinning layer may be an AFM layer or multilayer that pins the magnetization (not shown) of the pinned layer 230 by an exchange-bias interaction. However, in other embodiments, the optional pinning layer may be omitted or another structure may be used. In addition, in some embodiments, the orientation of the pinned layer 230 and free layer 210 to the substrate 201 may be reversed. Thus, the pinned layer 230 may be closer to the substrate than the free layer 210 in alternate embodiments.

In the embodiment shown in FIG. 3, the perpendicular magnetic anisotropy energies of the pinned layer 230 and of the free layer 210 each exceeds the out of plane demagnetization energies of the pinned layer 230 and free layer 210. Consequently, the magnetic moments 211 and 231 of the free layer 210 and the pinned layer 230, respectively, may be perpendicular to plane. Stated differently, the stable magnetic states for the free layer 231 may be with the moment oriented in the +z direction or the −z direction. The free layer 210 and pinned layer 230 each include a dashed line indicating that the portions of the layer 210 and/or 230 may be formed separately, with the use of a sacrificial insertion layer that is removed prior to completion of the magnetic junction 200.

The magnetic junction 200 is also configured to allow the free layer 210 to be switched between stable magnetic states when a write current is passed through the magnetic junction 200. Thus, the free layer 210 is switchable utilizing spin transfer torque when a write current is driven through the magnetic junction 200 in a current perpendicular-to-plane (CPP) direction. The data stored in the magnetic junction 210, and thus the direction of magnetization of the free layer 210, may be read by driving a read current through the magnetic junction 200. The read current may also be driven through the magnetic junction 200 in the CPP direction. Thus, the magnetoresistance of the magnetic junction 200 provides the read signal.

The magnetic junction 200 and free layer 210 may have improved performance due to fabrication using the step(s) 102 and/or 106. The benefits are describe below with respect to particular physical mechanisms. However, one of ordinary skill in the art will readily recognize that the method and system described herein are not dependent upon a particular physical explanation. If the free layer 210 is formed using a sacrificial insertion layer in step 102, the free layer 210 may be thicker, still have a perpendicular-to-plane stable states for the magnetic moment 211, improved magnetoresistance and/or less damping. If formed without a sacrificial insertion layer, a free layer is generally not more than approximately twelve Angstroms thick in order to maintain a perpendicular-to-plane magnetic moment. For example, a ferromagnetic CoFeB layer that is approximately fifteen Angstroms thick has an in-plane magnetic moment. Although a thinner free layer has a perpendicular-to-plane magnetic moment, magnetoresistance may be reduced. This reduction may be particularly noticeable if the free layer is between two MgO layers, such as an MgO seed layer and an MgO nonmagnetic spacer layer. It is believed that the reduction in tunneling magnetoresistance may be due to conflicts in the crystallinity of the free layer and MgO layers. Alternatively, free layer might be formed with a permanent insertion layer between two magnetic layers. Such a free layer may have a total thickness of greater than twelve Angstroms. The magnetic layers are still separated by the permanent insertion layer. Each of the magnetic layers is still on the order of not more than twelve Angstroms thick in order to maintain the perpendicular-to-plane magnetic moment. Such thinner magnetic/free layers may have a perpendicular-to-plane magnetic moment. In addition, magnetoresistance may be improved. For example, a permanent insertion layer such as W may reduce conflicts between the crystallinity of surrounding layers, such as MgO layers, and the free layer. This may allow for a higher magnetoresistance. However, damping may be higher than desired. Such a high damping may increase the switching current (write current required to switch the state of the magnetic moment of the free layer). A higher switching current is generally undesirable. Thus, performance for such a magnetic junction may suffer.

In contrast to such magnetic junctions, the magnetic junction 200 may have a higher magnetoresistance due the use of the sacrificial insertion layer (not shown in FIG. 3) during fabrication. Use of the sacrificial insertion layer and subsequent anneal of the bottom portion of the free layer 210 may allow for crystallization of the free layer 210 prior to formation of the nonmagnetic spacer layer 220. It is believed that this may be due at least in part to the affinity of the sacrificial insertion layer for B and O that may otherwise be in the free layer 210. The free layer 210 may thus be fabricated to a larger thickness while still maintaining the desired crystal structure and perpendicular anisotropy. For example, the free layer 210 is thicker than fifteen Angstroms, but still may have a perpendicular-to-plane magnetic moment 231. In some embodiments, the free layer 210 is not more than twenty-five Angstroms thick. For example, the free layer 210 may be at least sixteen Angstroms thick and not more than twenty Angstroms thick. The magnetic junction 200 may thus have a higher magnetoresistance. Removal of the sacrificial insertion layer may also reduce the damping in the free layer 210. The free layer 210 thus may exhibit a lower switching current. A smaller write current may be used in programming the magnetic junction. Performance may thus be improved.

The fabrication of the pinned layer 230 in step 106 may also improve performance of the magnetic junction 200 in a magnetic device. Because the bottom layers 204, 210, 220 and part of 230 may be defined prior to the entire pinned layer 230 being deposited, a thinner part of the magnetic junction 200 is removed during this definition step. Shadowing due to nearest neighbor magnetic junctions in a magnetic device during this definition step may be mitigated. Similar benefits may be achieved when defining the remaining portion of the magnetic junction 200, such as the remaining portion of the layer 230 and the capping layer(s) 206. Thus, the magnetic junction 200 may be placed closer to another magnetic junction (not shown in FIG. 3) without adversely affecting fabrication. Consequently, the manufacturing may be improved and a more densely packed memory device achieved. If both steps 102 and 106 use the sacrificial insertion layer, then benefits described above for both performance of the magnetic junction and the packing/fabrication of the magnetic device may be achieved.

Figure 4:
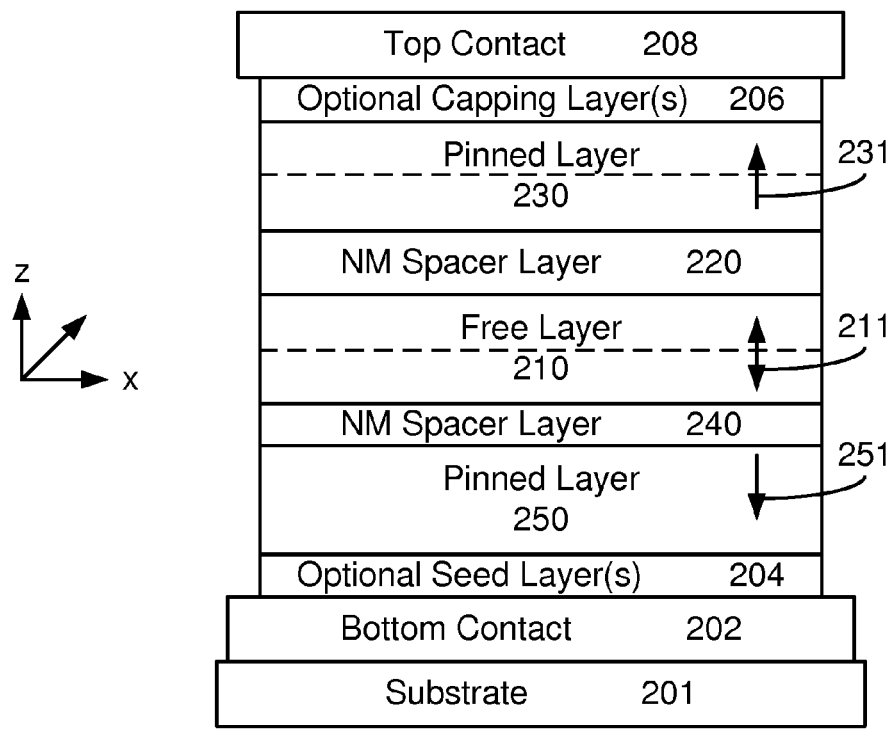
FIG. 4 depicts another exemplary embodiment of a magnetic junction usable in a magnetic memory programmable using spin transfer torque.

FIG. 4 depicts an exemplary embodiment of a magnetic junction 200' that may be fabricated using the method 100, as well as surrounding structures. For clarity, FIG. 4 is not to scale. The magnetic junction 200' may be used in a magnetic device such as a STT-RAM and, therefore, in a variety of electronic devices. The magnetic junction 200' is analogous to the magnetic junction 200. Consequently, similar components have analogous labels. The magnetic junction 200' includes a free layer 210 having magnetic moment 211, a nonmagnetic spacer layer 220, and a pinned layer 230 having magnetic moment 231 that are analogous to the free layer 210 having magnetic moment 211, the nonmagnetic spacer layer 220, and the pinned layer 230 having magnetic moment 231 depicted in the magnetic junction 200. Also shown is an underlying substrate 201, bottom contact 202, top contact 208, optional seed layer(s) 204 and optional capping layer(s) 206 that are analogous to the substrate 201, bottom contact 202, top contact 208, optional seed layer(s) 204 and optional capping layer(s) 206 for the magnetic junction 200.

The magnetic junction 200' shown in FIG. 4 is a dual magnetic junction. Thus, the magnetic junction 200' also includes an additional nonmagnetic spacer layer 240 and an additional pinned layer 250. The pinned layer 25 may be analogous to the pinned layer 230. Thus, the pinned layer 250 may have a perpendicular-to-plane magnetic moment 250. In the embodiment shown, the magnetic junction 200' is in a dual state. Thus, the magnetic moments 231 and 251 are antiparallel. In another embodiment, the magnetic moments 231 and 251 may be in an antidual, or parallel, state. In still other embodiments, the magnetic moments 231 and 251 may be switched between the antidual and dual states during operation. The nonmagnetic spacer layer 240 is analogous to the nonmagnetic spacer layer 220. However, the nonmagnetic spacer layer 240 may be a different thickness than and/or formed of different material(s) from the magnetic junction 200. For example, the layers 220 and 240 may both be (100) MgO. However, one layer, such as the nonmagnetic spacer layer 240, may be thinner. In some embodiments, the layer 240 may be on the order of thirty percent thinner than the layer 220.

The dual magnetic junction 200' may share the benefits of the magnetic junction 200. Thus, the magnetic junction 200' may have improved magnetoresistance, reduced damping and switching current, and/or may be packed more densely in a magnetic device.

Figure 5:
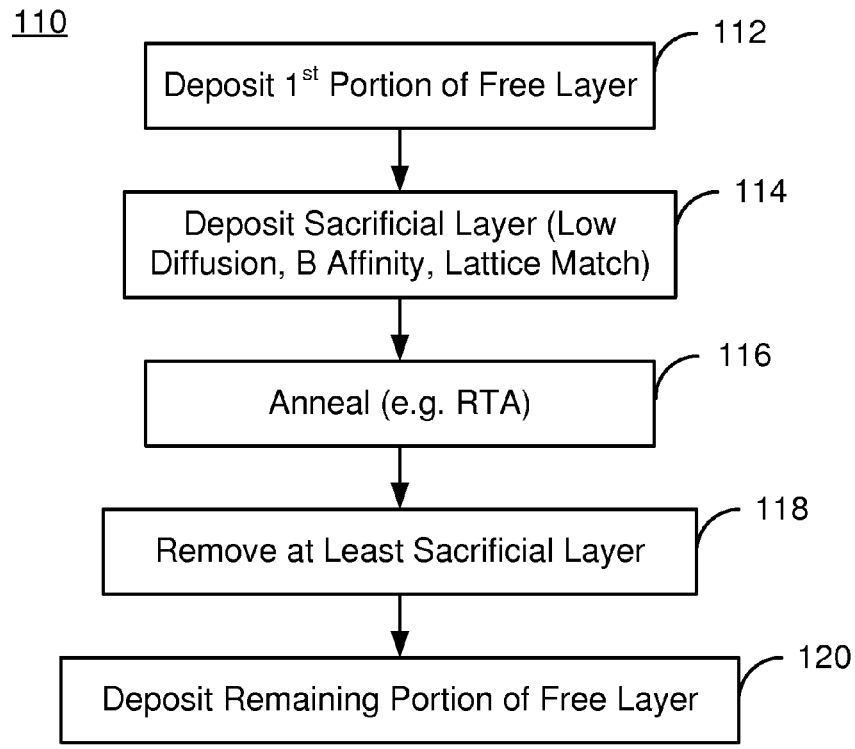
FIG. 5 depicts another exemplary embodiment of a method for providing a portion of a magnetic junction usable in a magnetic memory and programmable using spin transfer torque.

FIG. 5 depicts an exemplary embodiment of a method 110 for fabricating a portion of a magnetic junction usable in a magnetic device such as a STT-RAM and, therefore, in a variety of electronic devices. For simplicity, some steps may be omitted, performed in another or combined. Further, the method 110 may start after other steps in forming a magnetic memory have been performed. The method 110 may be used in performing the step 102 of the method 100. However, in other embodiments, the method 110 may be used in fabricating another portion of the magnetic junction 200 such as the pinned layer, and/or may be used in connection with another fabrication process.

The method 110 may start after other layer(s), such as seed layer(s) have been formed. For example, in one embodiment, the method 110 commences after a crystalline MgO seed layer having a (100) orientation has been deposited. If a dual magnetic junction is fabricated, the MgO "seed" layer may be another nonmagnetic spacer layer that has been formed on a pinned layer. In addition, a PEL may be provided as part of or in addition to the free layer.

A first portion of the free layer is deposited, via step 112. The first portion of the free layer may include a magnetic layer including Co, Fe and/or B. For example, a CoFeB layer, having not more than twenty atomic percent B, may be deposited. In some embodiments, the thickness of this ferromagnetic layer may be up to twenty-five Angstroms. In some embodiments, the ferromagnetic layer may be at least fifteen Angstroms. However in other embodiments, other thicknesses and/or other layers are possible.

A sacrificial insertion layer is deposited on the first ferromagnetic layer such that the layers share an interface, via step 114. The sacrificial insertion layer may thus include material(s) that have an affinity for boron, that have a low diffusion and that are a relatively good lattice match for the underlying CoFeB layer. For example, the difference in lattice parameters between the underlying ferromagnetic layer and the sacrificial insertion layer may be less than ten percent. The sacrificial insertion layer may include one or more of Bi, W, I, Zn, Nb, Ag, Cd, Hf, Os, Mo, Ca, Hg, Sc, Y, Sr, Mg, Ti, Ta, Ba, K, Na, Rb, Pb, and Zr. In some embodiments, the sacrificial insertion layer consists of Bi, W, I, Zn, Nb, Ag, Cd, Hf, Os, Mo, Ca, Hg, Sc, Y, Sr, Mg, Ti, Ba, Ta, K, Na, Rb, Pb, and/or Zr. In some embodiments, Ta and/or W may be used. Ta and/or W sacrificial insertion layers sufficiently match the lattice for the underlying CoFeB layer, have a sufficiently high boron affinity and a sufficiently low diffusion. The sacrificial insertion layer may be thin, for example less than ten Angstroms thick. In some such embodiments, the sacrificial insertion layer may not exceed five Angstroms and is greater than one Angstrom. The sacrificial insertion layer may be nominally four Angstroms thick. In other embodiments, other thickness(es) and/or material(s) may be used.

The sacrificial insertion layer and underlying layer(s) are then annealed at temperature(s) above room temperature, via step 116. For example, an RTA at temperature(s) in the range of 300-500 degrees Celsius may be used. In other embodiments, the anneal may be performed in another manner and/or at other temperature(s). The anneal of step 116 may be performed such that the underlying CoFeB layer, which is amorphous as deposited, crystallizes with the desired structure and orientation. In addition, excess B in the CoFeB layer and/or excess oxygen in the ferromagnetic layer may be taken up by the insertion layer during the anneal. For example, it is believed that during annealing the B in the CoFeB diffuses, and forms a BCC structure having a (001) orientation. In general, this crystallization is desired to be delayed in order to improve TMR. Thus, the CoFeB layer may be desired to be amorphous until the anneal.

After the anneal, the sacrificial insertion layer is removed, via step 118. For example, a plasma etch may be used. In other embodiments, the sacrificial insertion layer may be removed in another manner including but not limited to ion milling or chemical mechanical planarization. In step 118, some portion of the underlying CoFeB layer may be removed. After step 118, the remaining thickness of the CoFeB may be desired to be greater than zero but not more than fifteen Angstroms. In some embodiments, the remainder of the CoFeB layer formed in step 112 may be not more than twelve Angstroms. In some such embodiments, the CoFeB layer is not more than ten Angstroms thick after step 118. However, complete removal of the CoFeB layer is undesirable.

The remainder of the free layer, if any, may then be deposited, via step 120. For example, a second CoFeB ferromagnetic layer may be deposited on the exposed first ferromagnetic layer. Thus, the first and second magnetic (e.g. CoFeB) layers may share an interface. Alternatively, another layer, including a multilayer, may be formed. Despite the total amount of magnetic material present, the free layer to have a perpendicular magnetic anisotropy that exceeds the demagnetization energy. The remaining portion of the first ferromagnetic layer after step 118 and the second ferromagnetic layer provided in step 120 together have a total thickness that is greater than fifteen Angstroms. The total thickness of these two layers may not exceed thirty Angstroms. In some such embodiments, the total thickness does not exceed twenty-five Angstroms. For example, the total thickness may be at least sixteen Angstroms and less than twenty Angstroms. In some embodiments, the thicknesses of each of the first and second ferromagnetic layers are not more than fifteen Angstroms thick.

Figure 6:
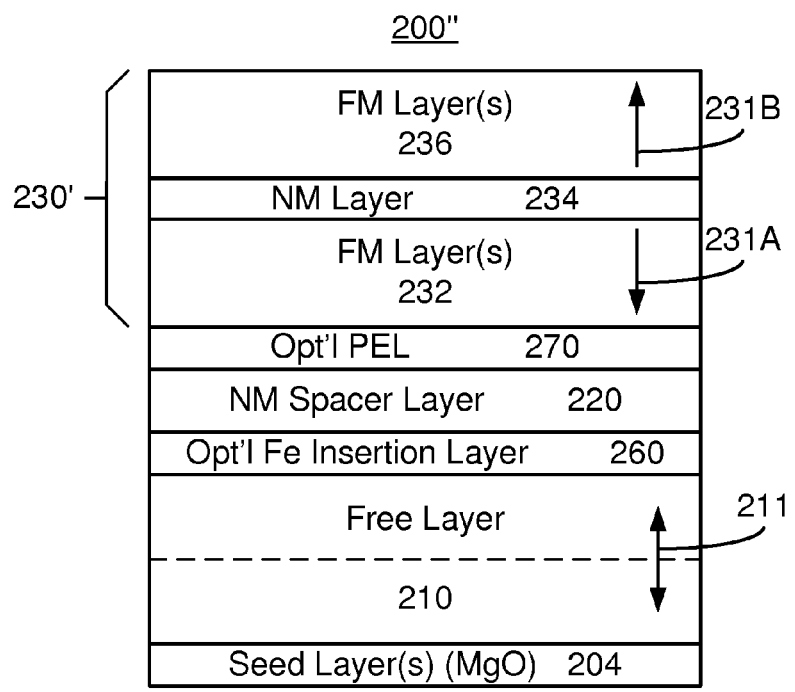
FIG. 6 depicts an exemplary embodiment of a magnetic junction usable in a magnetic memory programmable using spin transfer torque.

FIG. 6 depicts an exemplary embodiment of a magnetic junction 200" that may be fabricated using the method 110. For clarity, FIG. 6 is not to scale. The magnetic junction 200" may be used in a magnetic device such as a STT-RAM and, therefore, in a variety of electronic devices. The magnetic junction 200" is analogous to the magnetic junction 200. Consequently, similar components have analogous labels. The magnetic junction 200" includes a free layer 210' having magnetic moment 211', a nonmagnetic spacer layer 220, and a pinned layer 230' having magnetic moments 231A/231B that are analogous to the free layer 210 having magnetic moment 211, the nonmagnetic spacer layer 220, and the pinned layer 230 having magnetic moment 231 depicted in the magnetic junction 200. Also shown is an underlying optional seed layer(s) 204 that is analogous to the optional seed layer(s) 204 for the magnetic junction 200. The seed layer 204 may be a crystalline MgO seed layer in the embodiment shown. The MgO seed layer 204 may enhance the perpendicular magnetic anisotropy of the free layer 210'.

Also shown in FIG. 6 are optional Fe insertion layer 260 and optional PEL 270. For example, the PEL 270 may be a CoFeB alloy layer, a FeB alloy layer, a Fe/CoFeB bilayer, a half metallic layer or a Heusler alloy layer. Other high spin polarization materials may also be provided. In some embodiments, the PEL 270 is also configured to enhance the perpendicular magnetic anisotropy of the pinned layer 230. In addition, the pinned layer 230' is a SAF, including ferromagnetic layers 232 and 236 separated by nonmagnetic layer 234. The ferromagnetic layers 232 and 236 are antiferromagnetically coupled through the nonmagnetic layer 234. In some embodiments, one or more of the ferromagnetic layers 232 may be a multilayer. The pinned layer 230' may be fabricated using step 106 of the method 100. Thus, portions of the magnetic junction 200" may be defined before formation of part of the pinned layer 230'. In other embodiments, the layers 232, 234 and 236 may be deposited before the edges of the magnetic junction 230" are defined.

The magnetic junction 200" shown in FIG. 6 is formed using the method 110 for the step 102 of the method 100. The free layer 210' thus includes two portions, separated by a dashed line. The bottom portion of the free layer 210', under the dashed line, is deposited in step 112. Some portion of this layer may have been removed in step 118. The top portion of the free layer 210', above the dashed line, is deposited in step 120. Although the dashed line divides the free layer 210' substantially in half, different fractions of the free layer 210' may be above or below the dashed line. The free layer 210' may thus be considered to include a single ferromagnetic layer having a thickness greater than fifteen Angstroms. However, portions of this ferromagnetic layer deposited in different steps of the method 110. In the embodiment shown in FIG. 6, the free layer 210' consists of such the single ferromagnetic layer. In some embodiments, this ferromagnetic layer is a CoFeB layer including not more than twenty atomic percent B.

Because the free layer 210' is formed using a sacrificial insertion layer in the method 110, the free layer 210' may be thicker, still have a perpendicular-to-plane stable states for the magnetic moment 211, improved magnetoresistance and/or less damping. The sacrificial insertion layer and anneal used in steps 116-118 may improve the crystallinity of the free layer 210'. This may allow for a higher magnetoresistance. Removal of the sacrificial insertion layer in step 118 before deposition of the remaining portion of the free layer 210' improves the damping of the free layer 210'. The free layer 210' may thus be fabricated to a larger thickness while still maintaining the desired crystal structure and perpendicular anisotropy. For example, the free layer 210 is thicker than fifteen Angstroms, but still may have a perpendicular-to-plane magnetic moment 211. In some embodiments, the free layer 210 is not more than twenty-five Angstroms thick. For example, the free layer 210 may be at least sixteen Angstroms thick and not more than twenty Angstroms thick. The magnetic junction 200" may thus have a higher magnetoresistance. Removal of the sacrificial insertion layer may also reduce the damping in the free layer 210. The free layer 210 thus may exhibit a lower switching current. A smaller write current may be used in programming the magnetic junction. Performance may thus be improved.

The pinned layer 230' may also improve performance of the magnetic junction 200" in a magnetic device. In particular, part of the magnetic junction including layers 210, 260, 220, 270, and some portion of the layer 230' may be defined first. The remainder of the pinned layer 230' is defined later. Shadowing during these definition step(s) may be mitigated. Consequently, the manufacturing may be improved and a more densely packed memory device achieved.

Figure 7:
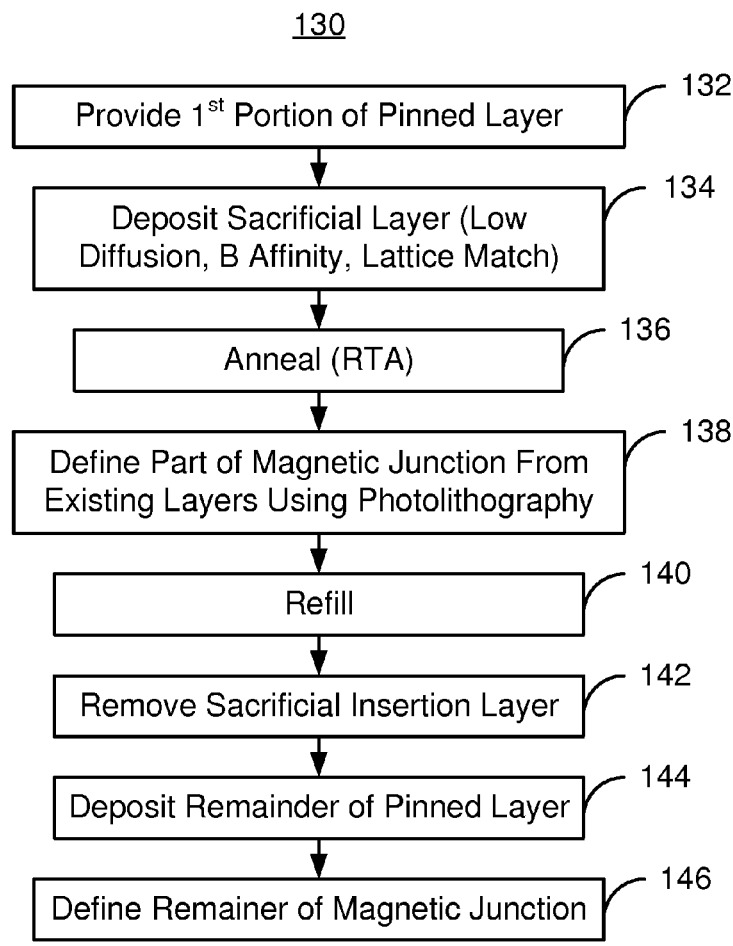
FIG. 7 depicts another exemplary embodiment of a method for providing a magnetic junction usable in a magnetic memory and programmable using spin transfer torque.

FIG. 7 depicts an exemplary embodiment of a method 130 for fabricating a portion of a magnetic junction usable in a magnetic device such as a STT-RAM and, therefore, in a variety of electronic devices. For simplicity, some steps may be omitted, performed in another or combined. Further, the method 130 may start after other steps in forming a magnetic memory have been performed. The method 130 is analogous to an embodiment of step 106 of the method 100. Thus, the method 130 may commence after the free layer and nonmagnetic spacer layer have been provided.

A first portion of the pinned layer is deposited, via step 132. This first portion of the pinned layer may be a single layer or a multilayer. For example, the first portion of the pinned layer may include a magnetic layer including Co, Fe and/or B. For example, a CoFeB layer, having not more than twenty atomic percent B, may be deposited. A PEL or other structure may also have been deposited between the pinned layer and the nonmagnetic spacer layer. A multilayer including ferromagnetic layers interleaved with nonmagnetic layers, such as a Co/Pt multilayer, might also be deposited. If the pinned layer being formed in the method 130 is a SAF, step 132 may include depositing a portion of the magnetic (multi)layer; the magnet (multi)layer and some or all of the nonmagnetic layer; or the magnetic (multi)layer, the nonmagnetic layer and a portion of the top magnetic (multi) layer. In general, however, a smaller portion of the pinned layer is deposited in step 132. This allows for a thinner structure to be defined in step 138, below.

A sacrificial insertion layer is deposited on the portion of the pinned layer that has been formed, via step 134. The sacrificial insertion layer may include material(s) that have an affinity for boron, that have a low diffusion and that are a relatively good lattice match for the underlying layer. For example, the difference in lattice parameters between the underlying ferromagnetic layer and the sacrificial insertion layer may be less than ten percent. For example, the sacrificial insertion layer may include one or more of Bi, W, I, Zn, Nb, Ag, Cd, Hf, Os, Mo, Ca, Hg, Sc, Y, Sr, Mg, Ti, Ba, K, Na, Rb, Pb, and Zr. In some embodiments, the sacrificial insertion layer consists of Bi, W, I, Zn, Nb, Ag, Cd, Hf, Os, Mo, Ca, Hg, Sc, Y, Sr, Mg, Ti, Ba, K, Na, Rb, Pb, and/or Zr. The sacrificial insertion layer may be thin. The sacrificial insertion layer is, however, desired to be continuous to allow for patterning, discussed below.

The sacrificial insertion layer and underlying layer(s) are then annealed, via step 136. For example, an RTA at temperature(s) in the range of 300-400 degrees Celsius may be used. In other embodiments, the anneal may be performed in another manner. Thus, not only the portion of the pinned layer deposited in step 132 and the sacrificial insertion layer are annealed in step 136, but also the nonmagnetic spacer layer and free layer which may reside below the sacrificial insertion layer. Thus, the temperature and other characteristics of the anneal may be desired to be sufficiently low that the nonmagnetic spacer layer, such as a crystalline MgO tunneling barrier layer, is not adversely affected.

After the anneal, the portion of the magnetic junction under the sacrificial insertion layer is photolithographically defined, via step 138. Step 138 may thus include providing a photoresist layer and patterning the photoresist layer to provide a photoresist mask. Other materials may also be used for the mask. The mask covers the portions of the deposited layers that are to form part of the magnetic junction. The regions around the magnetic junction are exposed. The edges of the magnetic junction may be defined using an ion mill or other mechanism for etching the exposed portions of the layers. The ion mill may be carried out at a small angle with respect to normal to the top of the sacrificial layer.

A refill step is then performed, via step 140. Thus, a nonmagnetic insulating layer such as alumina may be deposited. A planarization might also be performed in order to provide a flat surface for subsequent processing.

The sacrificial layer may then be removed, via step 142. Step 142 may be performed via plasma etching. Other removal methods may also be used. In the removal step, some portion of the underlying part of the pinned layer may be removed. The remainder of the pinned layer, if any, may then be deposited, via step 144. For example, additional ferromagnetic layer(s) may be deposited directly on the exposed first ferromagnetic layer. In embodiments in which the pinned layer is a SAF, the layers deposited depend upon the fraction of the pinned layer deposited in step 132. For example, if the entire bottom ferromagnetic layer (or multilayer) was deposited in step 132, then the nonmagnetic layer such as Ru and another magnetic layer may be deposited in step 144. In other embodiments, the pinned layer may be formed in another manner.

The remaining portion of the magnetic junction may be defined, via step 146. Step 146 may be carried out photolithographically, in a manner analogous to step 138. However, because the free layer has already been defined in step 138, a lower density pattern may be used in step 146. Thus, the top of the magnetic junction may be less wide than the bottom. In other embodiments, the upper portion of the magnetic junction may be the same size as or wider than the lower portion of the magnetic junction. In some embodiments, the top portions of the pinned layers might extend over multiple magnetic junctions.

Figure 8:
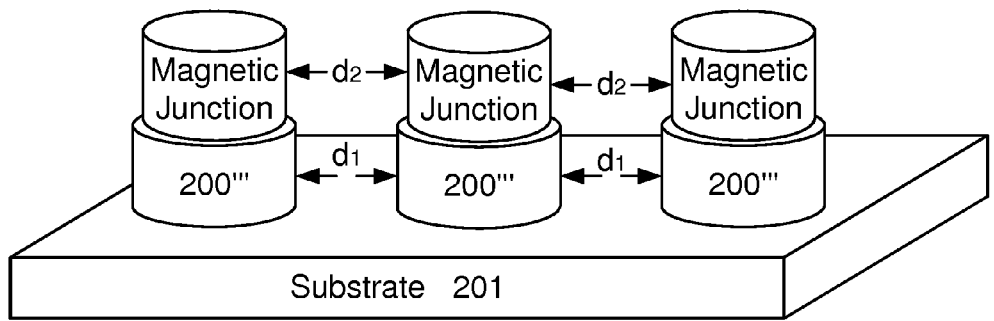
FIG. 8 depicts an exemplary embodiment of magnetic junctions usable in a magnetic memory programmable using spin transfer torque.

FIG. 8 depicts an exemplary embodiment of a magnetic memory including magnetic junctions 200''' that may be fabricated using the method 130. For clarity, FIG. 8 is not to scale. The magnetic junctions 200''' may be used in a magnetic device such as a STT-RAM and, therefore, in a variety of electronic devices. The magnetic junctions 200''' are analogous to the magnetic junctions 200, 200' and/or 200". However, for simplicity the individual layers of the magnetic junctions 200''' are not shown.

As can be seen in FIG. 8, the lower portions of the magnetic junctions 200''' defined in step 138 are spaced apart by distance, $d_1$. The upper portions of the magnetic junctions 200''', defined in step 146, are separated by distance $d_2$. Further $d_1 < d_2$. Thus, the photoresist masks used for steps 138 and 146 have a different density. In other embodiments, the density could be the same such that $d_1 = d_2$. In still other embodiments, the density of the mask used in step 146 may be greater than that of the mask used in step 138. Thus, $d_1 > d_2$ in such an embodiment. In still other embodiments, the top portions of the magnetic junctions 200''' might be connected. Further, the aspect ratios, footprints and other geometric parameters of the tops and bottoms of the magnetic junction 200''' may be different. Although only three magnetic junctions are shown, another number are typically fabricated together. In addition, a two-dimensional array of magnetic junctions are typically manufactured together on a substrate. For clarity, only a line of three is shown.

Using the method 130, performance and fabrication of the magnetic junctions 200''' may be improved. The lower portions of the magnetic junctions 200''' may be defined first. The remainder of the pinned layer 230' is defined later. The portions of the stacks being defined in steps 138 and 146 are thinner. As a result, shadowing during these definition steps may be mitigated. Thus, the bottom portions of the magnetic junctions 200''' may be more closely packed and better defined. The upper portions of the magnetic junctions 200''' do not include the free layer. The spacing between these portions of the magnetic junctions 200''' is less critical. These portions may be spaced further apart. Thus, better process control and integration may be achieved. Further, separately configuring these sections of the magnetic junctions 200''' may allow for tailoring the geometry for improved performance. Consequently, the manufacturing may be improved and a more densely packed memory device achieved. If the free layers of the magnetic junctions 200''' are fabricated using the method 110, performance may be further improved.

Figure 9:
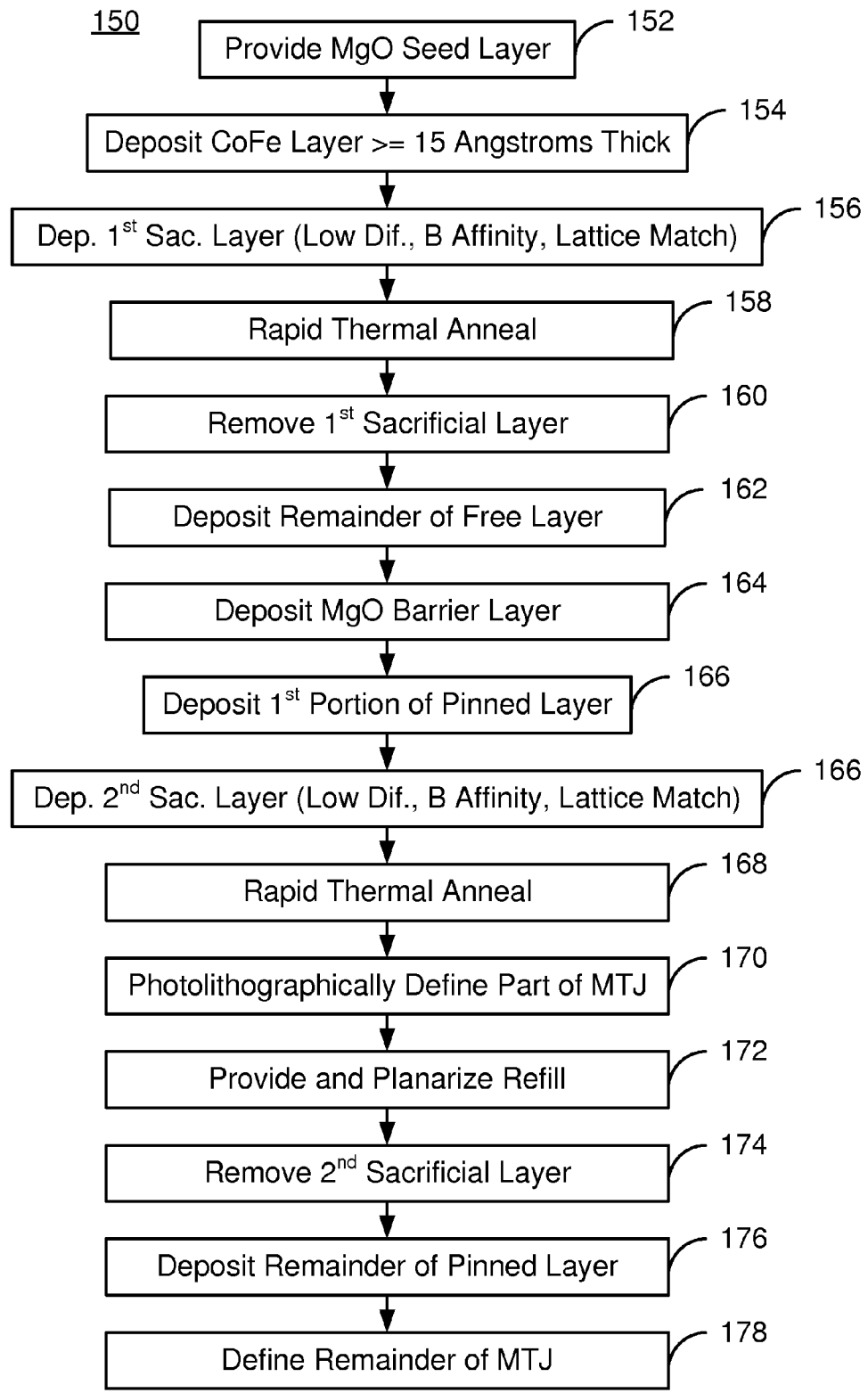
FIG. 9 depicts another exemplary embodiment of a method for providing a magnetic junction usable in a magnetic memory and programmable using spin transfer torque.

FIG. 9 depicts an exemplary embodiment of a method 150 for fabricating a magnetic junction usable in a magnetic device such as a STT-RAM and, therefore, in a variety of electronic devices. For simplicity, some steps may be omitted, performed in another or combined. Further, the method 130 may start after other steps in forming a magnetic memory have been performed. FIGS. 10-24 depict embodiments of a magnetic junction during fabrication using the method 150. FIGS. 10-24 are not to scale.

A crystalline MgO seed layer is deposited, via step 152. In some embodiments, step 152 forms one nonmagnetic spacer layer as a dual magnetic junction. Thus, a pinned layer would reside below the crystalline MgO layer. In other embodiments, the layer deposited in step 152 may be a seed layer for a bottom magnetic junction.

A first CoFeB layer of the free layer is deposited, via step 154. This layer is analogous to those described above in steps 102 and 112. In some embodiments, the ferromagnetic layer may be at least fifteen Angstroms. However in other embodiments, other thicknesses and/or other layers are possible. FIG. 10 depicts the magnetic junction 300 after step 154 is performed. Thus, the MgO seed layer 302 and first ferromagnetic layer 312 of the free layer are shown.

A sacrificial insertion layer is deposited on the first ferromagnetic layer 302, via step 156. Step 156 is thus analogous to step 114. The material(s) and thickness of the sacrificial insertion layer are thus as described above. FIG. 11 depicts the magnetic junction 300 after step 156 is performed. Thus, the sacrificial insertion layer 304 is shown. In some embodiments, the materials and thicknesses of the sacrificial insertion layer 304 are analogous to those described above for the methods 100 and 110.

The layers 302, 304 and 312 are then annealed, via step 158. For example, an RTA at temperature(s) in the range of 300-400 degrees Celsius may be used. The anneal of step 158 is thus analogous to that of step 116. After the anneal, the sacrificial insertion layer 304 is removed, via step 160. Step 160 is analogous to step 118. For example, a plasma etch may be used. FIG. 12 depicts the magnetic junction 300 after step 160 is performed. Thus, the sacrificial insertion layer 304 has been removed. Some portion of the first ferromagnetic layer 312' may be removed. A slightly thinner ferromagnetic layer 312' is thus shown.

In some embodiments, the remainder of the free layer is deposited, via step 162. For example, a second CoFeB ferromagnetic layer may be deposited on the exposed first ferromagnetic layer. 312'. FIG. 13 depicts the magnetic junction 300 after step 162. Thus, the second ferromagnetic layer 314 has been deposited. The layers 312' and 314 together for the free layer 310.

The nonmagnetic spacer layer is provided, via step 164. In some embodiments, a crystalline MgO barrier layer is provided in step 164. FIG. 14 depicts the magnetic junction 300 after step 164 is performed. Thus, the nonmagnetic spacer layer 320 has been fabricated.

Figure 15:
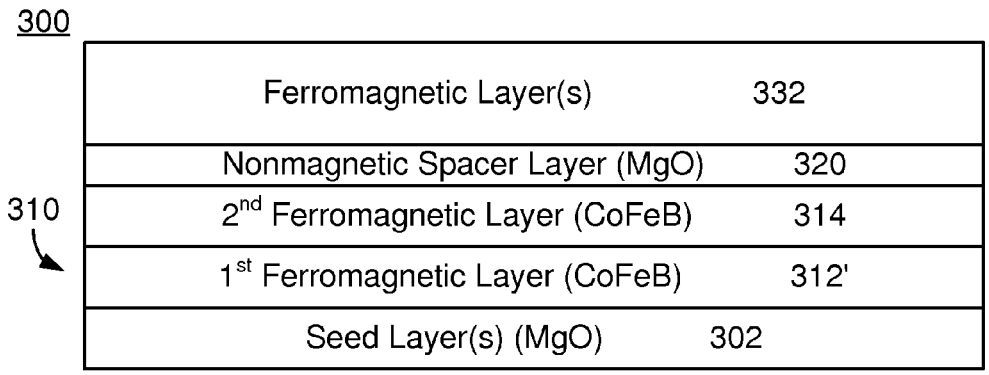

A first portion of the pinned layer is deposited, via step 166. Step 166 is analogous to step 132. Thus, a single layer or a multilayer including ferromagnetic layers and/or nonmagnetic layers may be deposited. FIG. 15 depicts the magnetic junction 300 after step 166. Thus, ferromagnetic layer(s) 332 are shown. In the embodiment depicted in FIGS. 15-24, the entire lower layer/multilayer of a SAF pinned layer is provided in step 166. However, in other embodiments, more layers or less of the magnetic layer 332 may be deposited in step 166.

Figure 16:
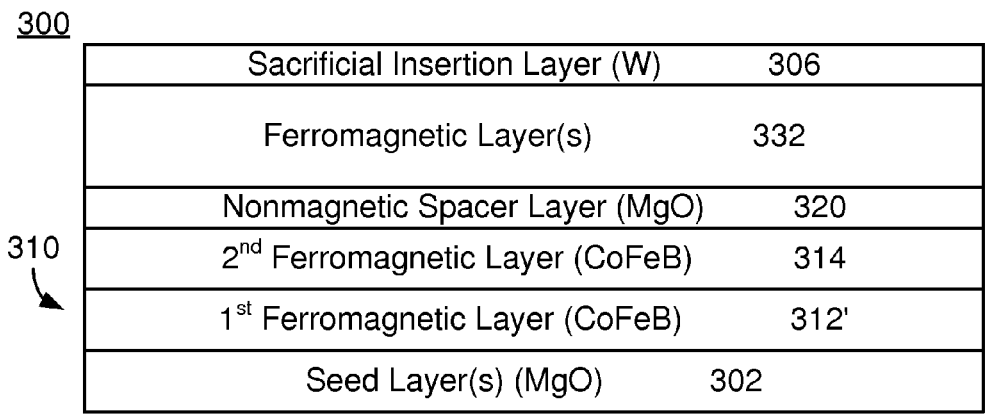

An additional sacrificial insertion layer is deposited on the ferromagnetic layer 332, via step 166. Step 166 is analogous to step 134. Thus, the material(s) and thicknesses described above may be used. FIG. 16 depicts the magnetic junction 300 after step 168 is performed. Thus, the sacrificial insertion layer 306 is shown.

The layers 302, 312', 314, 320 and 306 are annealed, via step 168. Step 168 is analogous to step 136. For example, an RTA at temperature(s) described above may be performed. The temperature and other characteristics of the anneal may be desired to be sufficiently low that the nonmagnetic spacer layer, such as a crystalline MgO tunneling barrier layer, is not adversely affected.

Figure 17:
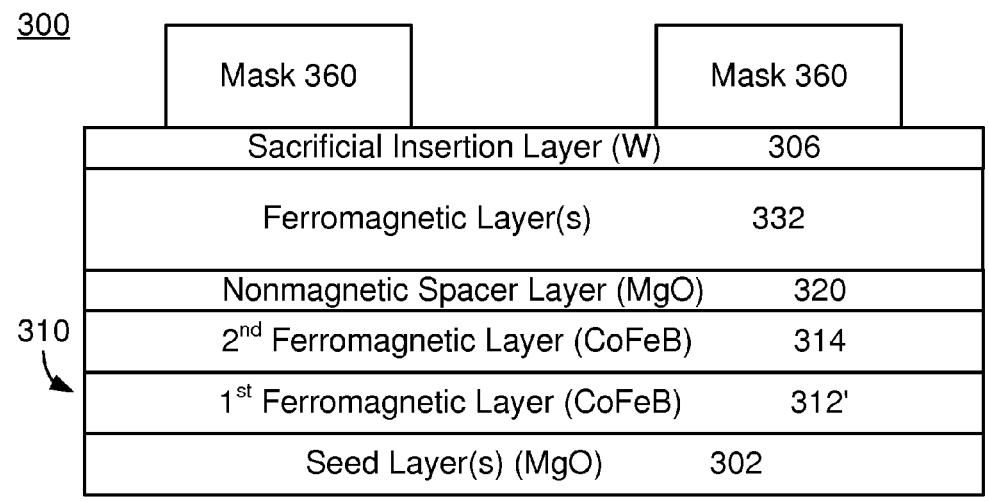
Figure 18:
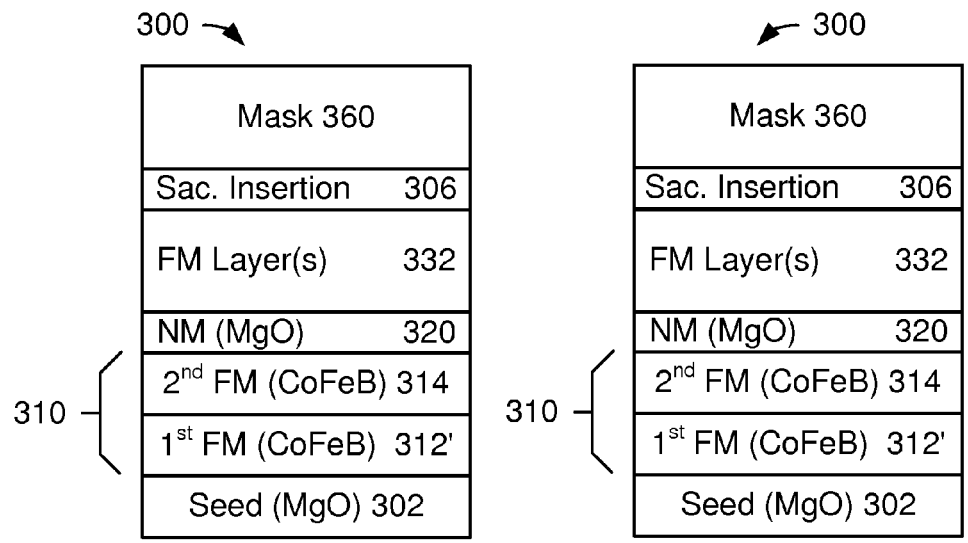

After the anneal, the portion of the magnetic junction 300 under the sacrificial insertion layer is photolithographically defined, via step 170. Step 170 is analogous to step 138. FIG. 17 depicts the magnetic junction during step 170. Thus, a mask 360 has been provided on the sacrificial insertion layer 306. FIG. 18 depicts the magnetic junction after step 170. Thus, portions of two magnetic junctions 300 have been defined. In particular, the free layer 310, nonmagnetic layer 320 and ferromagnetic layer 332 have been defined.

Figure 19:
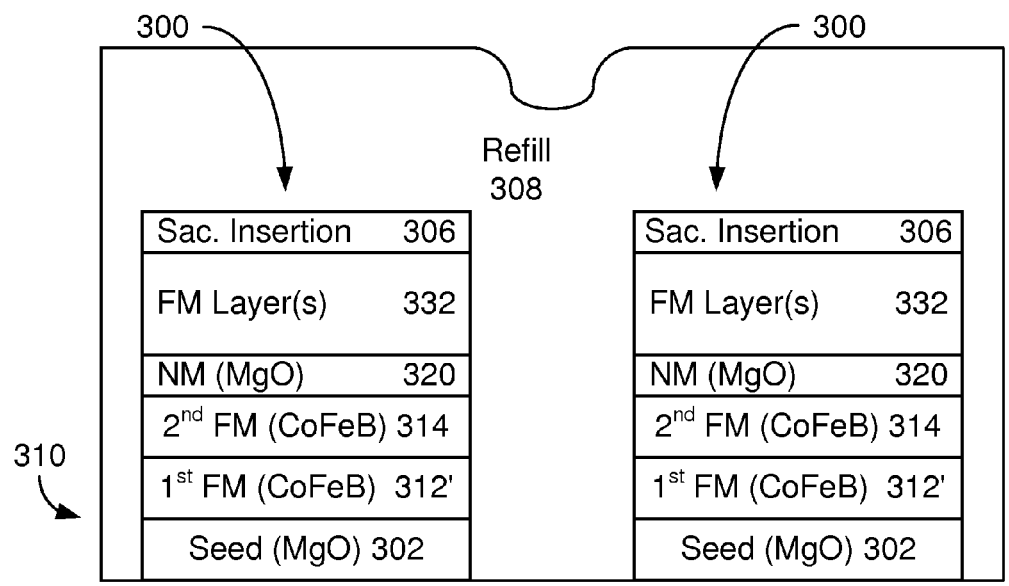
Figure 20:
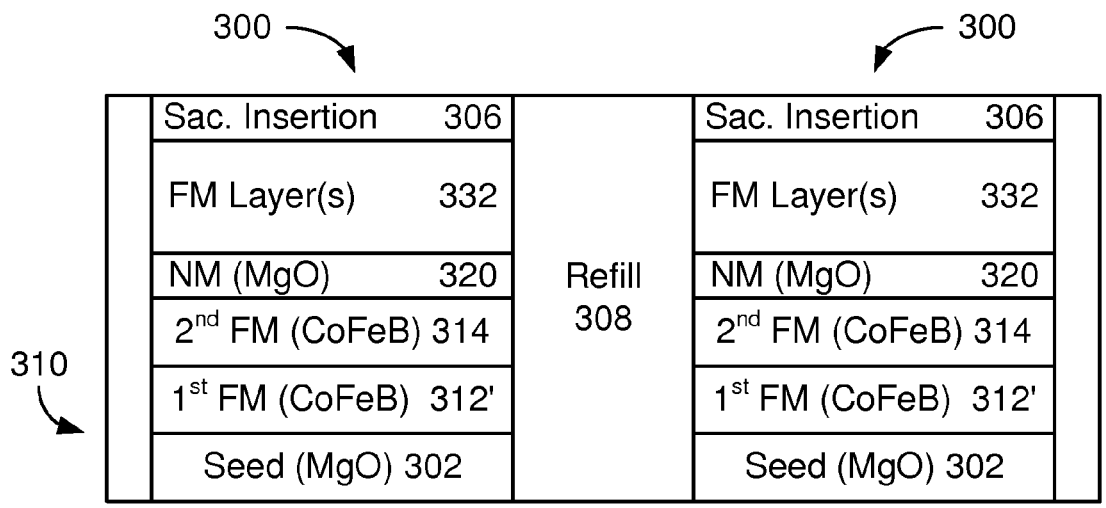

A refill step is then performed, via step 172. Thus, a nonmagnetic insulating layer such as alumina may be deposited and planarized. Step 172 is analogous to step 140. FIGS. 19-20 depict the magnetic junction during and after step 172. Thus, the refill material 308 is depicted in FIG. 19. FIG. 20 depicts the magnetic junctions 300 after step 172 is completed. Thus, the top surface of the refill 308 has been planarized.

Figure 21:
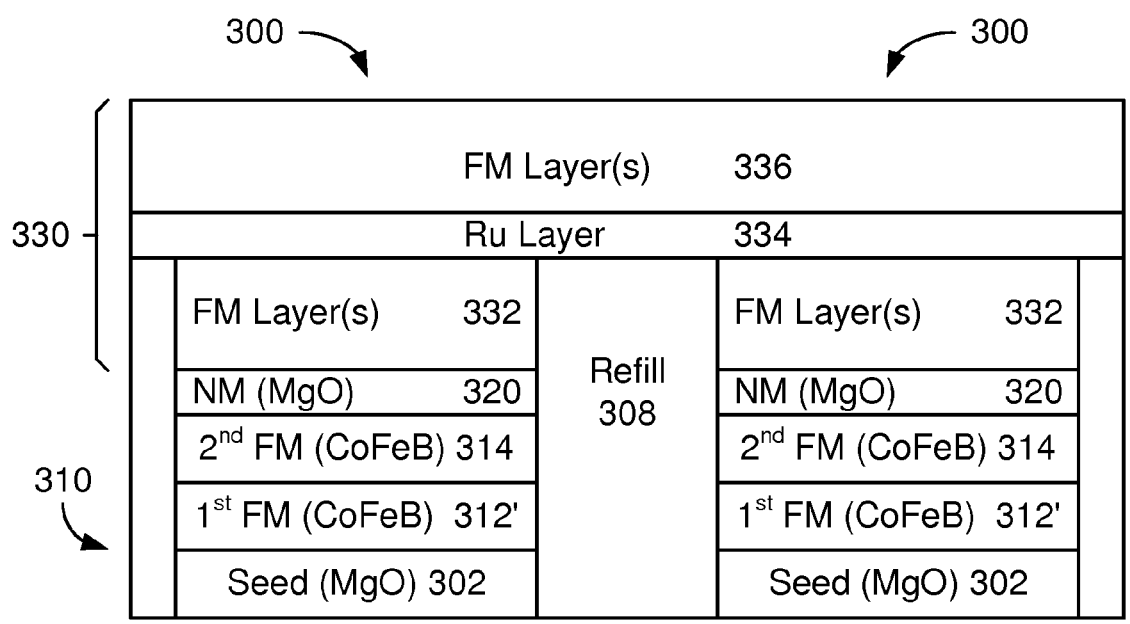

The sacrificial layer may then be removed, via step 174. Step 174 is analogous to step 142. The remainder of the pinned layer, if any, may then be deposited, via step 176. Step 176 is analogous to step 144. FIG. 21 depicts one embodiment of the magnetic junction 300 after step 174 is completed. In the embodiment shown, the entire bottom ferromagnetic layer (or multilayer) 332 was deposited in step 166. Thus, the nonmagnetic layer such as Ru and another magnetic layer may be deposited in step 174 and are. Thus, a nonmagnetic layer such as Ru layer 334 and ferromagnetic layer(s) 336 are shown. Note that the layers 334 and 336 extend across two junctions 300. The layers 332, 33 and 336 form a SAF pinned layer.

Figure 22:
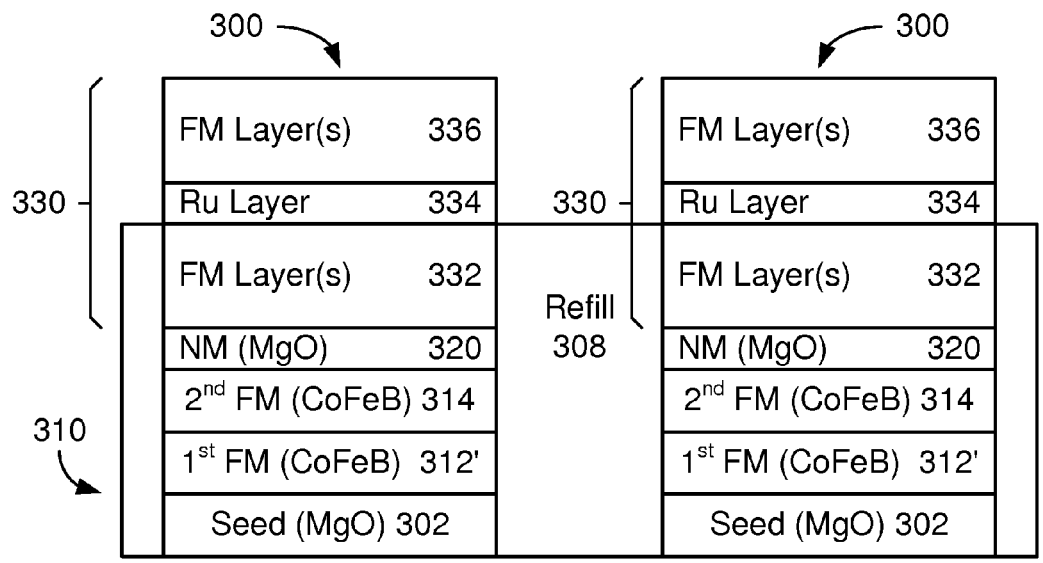

The remaining portion of the magnetic junction may be defined, via step 178. Step 178 is analogous to step 146. Step 178 may be carried out photolithographically, in a manner analogous to step 170. However, because the free layer has already been defined in step 170, a different density pattern may be used in step 178. Thus, the top of the magnetic junction may be less wide, the same size as, or wider than the bottom. In some embodiments, the top portions of the pinned layers might extend over multiple magnetic junctions. FIG. 22 depicts an embodiment of the magnetic junction 300 after step 178 is carried out. Thus, the pinned layers 330 have been defined. In the embodiment shown, the top of the pinned layer 330 is the same size as the bottom.

Figure 23:
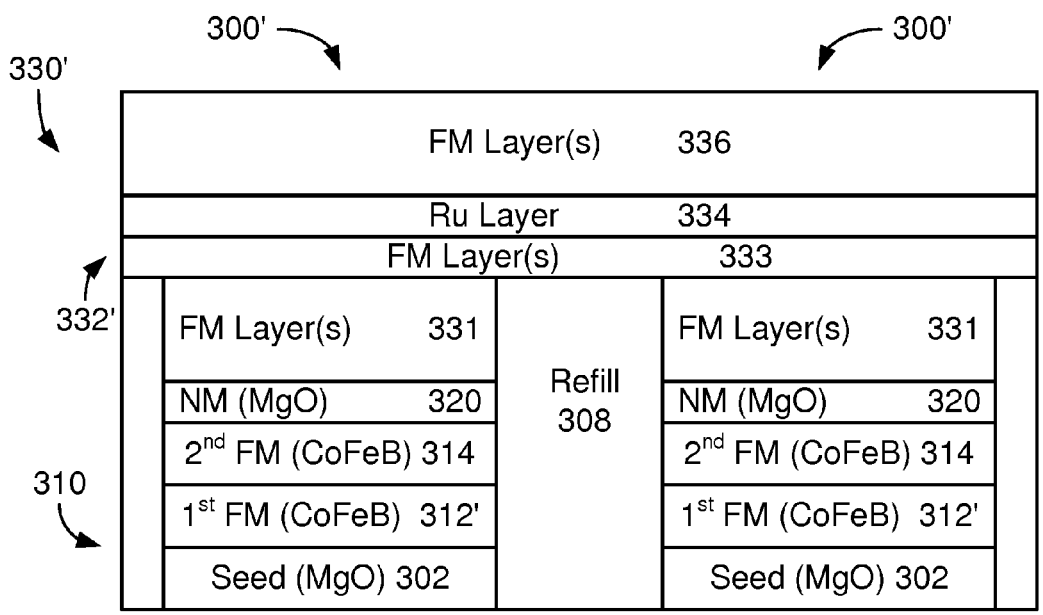
FIGS. 23-24 depicts another exemplary embodiment of a magnetic junction usable in a magnetic memory and programmable using spin transfer torque during fabrication.
Figure 24:
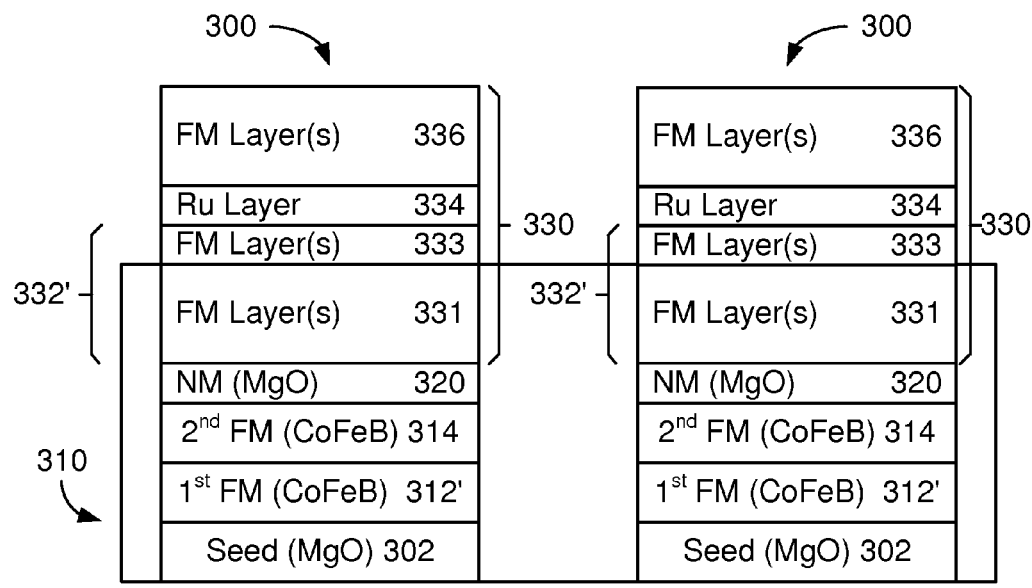

FIGS. 23-24 depict an embodiment of the magnetic junction 300' in which not all of the layer 332 is deposited in step 166. FIG. 23 depicts such an embodiment after step 176 has been performed. Thus, layers 333, 334 and 336 are shown. Layers 333 and 331 together form the bottom ferromagnetic layer 332' of the SAF pinned layer 330'. FIG. 24 depicts the magnetic junction after step 178 has been performed. Thus, the top portion of the magnetic junctions 300' have been defined.

The magnetic junctions 300 and 300' may share the benefits of the magnetic junctions 200, 200', 200" and/or 200'''. Thus, the magnetic junction 200' may have improved magnetoresistance, reduced damping and switching current, and/or may be packed more densely in a magnetic device.

Figure 25:
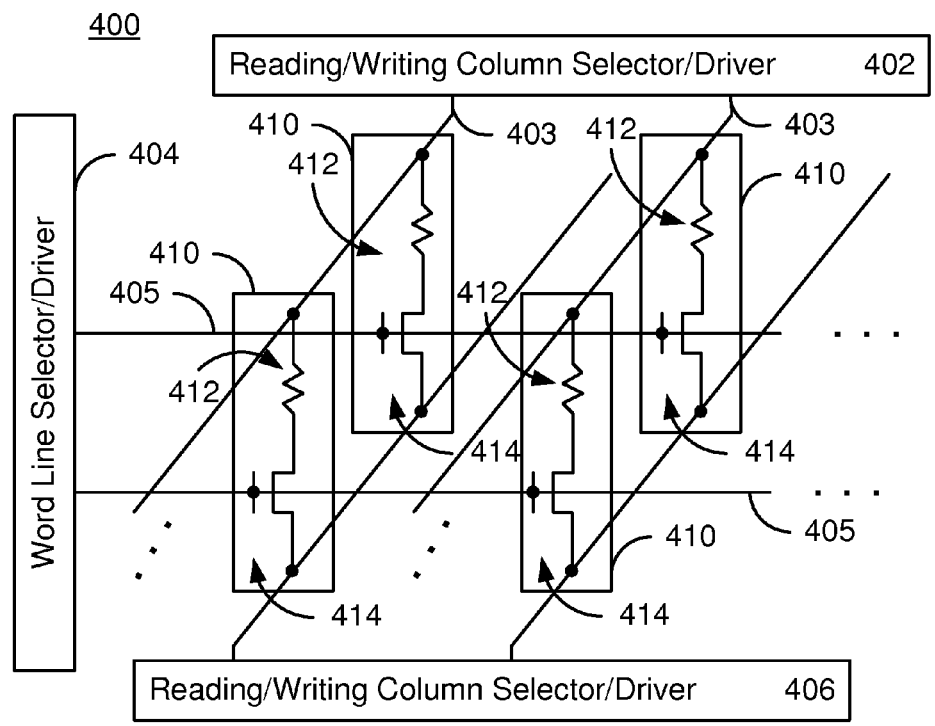
FIG. 25 depicts an exemplary embodiment of a memory utilizing magnetic junctions in the memory element(s) of the storage cell(s).

FIG. 25 depicts an exemplary embodiment of a memory 400 that may use one or more of the magnetic junctions 200, 200', 200", 200''', 300 and/or 300'. The magnetic memory 400 includes reading/writing column select drivers 402 and 406 as well as word line select driver 404. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junctions 200, 200', 200", 200''', 300 and/or 300' disclosed herein. Although one magnetic junction 412 is shown per cell 410, in other embodiments, another number of magnetic junctions 412 may be provided per cell. As such, the magnetic memory 400 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing a magnetic junction on a substrate usable in a magnetic device, the method comprising:
   providing a free layer, the free layer being switchable between a plurality of stable magnetic states when a write current is passed through the magnetic junction;
   providing a nonmagnetic spacer layer; and
   providing a pinned layer, the nonmagnetic spacer layer residing between the pinned layer and the free layer;
   wherein at least one of the step of providing the free layer includes a first plurality of steps and the step of providing the pinned layer includes a second plurality of steps, the first plurality of steps including
      depositing a first portion of the free layer;
      depositing a first sacrificial layer;
      annealing at least the first portion of the free layer and the first sacrificial layer at a first temperature greater than 25 degrees Celsius;
      removing the first sacrificial layer; and
      depositing a second portion of the free layer;
   the second plurality of steps including
      depositing a first portion of the pinned layer;
      depositing a second sacrificial layer;
      annealing at least the first portion of the pinned layer and the second sacrificial layer at a second temperature greater than 25 degrees Celsius;
      defining a portion of the magnetic junction including the free layer, the nonmagnetic spacer layer and the first portion of the pinned layer;
      removing the second sacrificial layer; and
      depositing a second portion of the pinned layer.

2. The method of claim 1 wherein the step of providing the free layer includes the first plurality of steps and wherein the free layer has a perpendicular magnetic anisotropy energy greater than an out-of-plane demagnetization energy.

3. The method of claim 2 wherein the free layer has a thickness greater than fifteen Angstroms.

4. The method of claim 3 wherein the thickness of the free layer does not exceed twenty-five Angstroms.

5. The method of claim 2 wherein the first sacrificial layer includes at least one of Bi, W, I, Zn, Nb, Ag, Cd, Hf, Os, Mo, Ca, Hg, Sc, Y, Sr, Mg, Ti, Ba, K, Na, Rb, Pb, and Zr.

6. The method of claim 2 further comprising:
   depositing an MgO seed layer before the step of providing the free layer.

7. The method of claim 2 wherein the annealing step includes performing a rapid thermal anneal.

8. The method of claim 2 wherein the first portion of the free layer has a first thickness, the second portion of the free layer has a second thickness, the first thickness being less than fifteen Angstroms thick, the second thickness being less than fifteen Angstroms thick.

9. The method of claim 1 wherein the step of providing the pinned layer includes the second plurality of steps and wherein the method further includes:
   depositing at least one refill material before the step of removing the second sacrificial layer.

10. The method of claim 9 further comprising:
performing a planarization after the step of depositing the at least one refill material.

11. The method of claim 9 wherein the pinned layer is a synthetic antiferromagnetic including a first ferromagnetic layer, a second ferromagnetic layer and a coupling layer between the first ferromagnetic layer and the second ferromagnetic layer, the step of depositing the second portion of the pinned layer includes:
depositing at least the nonmagnetic layer; and
depositing the second ferromagnetic layer.

12. The method of claim 11 wherein the step of depositing the second portion of the pinned layer further includes depositing a portion of the first ferromagnetic layer.

13. The method of claim 11 wherein at least one of the first ferromagnetic layer and the second ferromagnetic layer is a multilayer.

14. The method of claim 11 further comprising:
defining the remaining portion of the pinned layer.

15. The method of claim 9 wherein the step of defining the portion of the magnetic junction further includes:
providing a photoresist mask on the sacrificial layer, the photoresist mask covering a portion of the sacrificial layer corresponding to the magnetic junction; and
removing an exposed portion of the sacrificial layer, the first portion of the pinned layer, the nonmagnetic spacer layer and the free layer exposed by the photoresist mask.

16. The method of claim 1 further comprising:
providing an additional nonmagnetic spacer layer, the free layer being between the additional nonmagnetic spacer layer and the nonmagnetic spacer layer; and
providing an additional pinned layer, the additional nonmagnetic spacer layer being between the additional pinned layer and the free layer.

17. A method for providing a magnetic memory on a substrate usable in a magnetic device, the method comprising:
depositing a first ferromagnetic layer of a free layer, the first ferromagnetic layer of the free layer including a CoFeB layer not more than fifteen Angstroms thick;
depositing a first sacrificial layer on the first ferromagnetic layer, the first sacrificial layer being not more than four Angstroms thick and including at least one of Bi, W, I, Zn, Nb, Ag, Cd, Hf, Os, Mo, Ca, Hg, Sc, Y, Sr, Mg, Ti, Ba, K, Na, Rb, Pb, and Zr;
annealing at least the first ferromagnetic layer and the first sacrificial layer at a first temperature greater than 25 degrees Celsius, the annealing further including performing a first rapid thermal anneal (RTA);
removing at least the first sacrificial layer; and
depositing a second ferromagnetic layer of the free layer on a remaining portion of the first ferromagnetic layer, the second ferromagnetic layer including a CoFeB layer not more than fifteen Angstroms thick such that the remaining portion of the first ferromagnetic layer and the second ferromagnetic layer together have a thickness of not more than twenty-five Angstroms and the free layer has a perpendicular magnetic anisotropy energy greater than an out-of-plane demagnetization energy, the free layer being switchable between a plurality of stable magnetic states when a write current is passed through the magnetic junction;
providing a MgO tunneling barrier layer;
depositing a first portion of a pinned layer, the nonmagnetic spacer layer residing between the pinned layer and the free layer;
depositing a second sacrificial layer, the second sacrificial layer being not more than four Angstroms thick and including at least one of Bi, W, I, Zn, Nb, Ag, Cd, Hf, Os, Mo, Ca, Hg, Sc, Y, Sr, Mg, Ti, Ba, K, Na, Rb, Pb, and Zr;
annealing at least the first portion of the pinned layer, the remaining portion of the first ferromagnetic layer, the second ferromagnetic layer and the second sacrificial layer at a second temperature greater than 25 degrees Celsius, the annealing further including performing a second RTA;
providing a photoresist mask on the sacrificial layer after the second RTA, the photoresist mask covering a portion of the sacrificial layer corresponding to at least one magnetic junction;
defining a portion of the at least one magnetic junction including the free layer, the nonmagnetic spacer layer and the first portion of the pinned layer using the photoresist mask;
depositing at least one refill material;
performing a planarization after the step of depositing the at least one refill material
removing the second sacrificial layer after the planarization;
depositing at least a second portion of the pinned layer; and
defining a remaining portion of the at least one magnetic junction after the step of depositing the at least the second portion of the pinned layer.

* * * * *